United States Patent [19]
Bergemont

[11] Patent Number: 5,994,186
[45] Date of Patent: Nov. 30, 1999

[54] CONTACTLESS FLASH EPROM USING POLY SILICON ISOLATION AND PROCESS OF MAKING THE SAME

[75] Inventor: Albert Bergemont, Palo Alto, Calif.

[73] Assignee: National Semiconductor Corporation, Santa Clara, Calif.

[21] Appl. No.: 09/144,720

[22] Filed: Sep. 1, 1998

Related U.S. Application Data

[62] Division of application No. 08/990,476, Dec. 15, 1997, Pat. No. 5,847,426.

[51] Int. Cl.$^6$ ............................................. H01L 21/8247
[52] U.S. Cl. ........................... 438/257; 438/258; 438/593
[58] Field of Search ................................ 438/257, 258, 438/263, 264, 266, 282, 593, 594, 22

[56] References Cited

U.S. PATENT DOCUMENTS

| | | | |
|---|---|---|---|
| 4,180,826 | 12/1979 | Shappir | 357/41 |
| 5,032,881 | 7/1991 | Sardo et al. | 257/316 |
| 5,102,814 | 4/1992 | Woo | 438/263 |
| 5,111,257 | 5/1992 | Andoh et al. | 357/234 |
| 5,212,541 | 5/1993 | Bergemont | 257/319 |
| 5,245,212 | 9/1993 | Gill | 257/504 |
| 5,371,030 | 12/1994 | Bergemont | 437/52 |
| 5,460,990 | 10/1995 | Bergemont | 438/258 |
| 5,672,892 | 9/1997 | Ogura et al. | 257/214 |
| 5,760,454 | 6/1998 | Nishi | 257/401 |

*Primary Examiner*—Carl Whitehead, Jr.
*Assistant Examiner*—Maria Guerrero
*Attorney, Agent, or Firm*—Limbach & Limbach L.L.P.

[57] ABSTRACT

A contactless flash EPROM cell array with poly 1 isolation blocks and process for its manufacture. The cell array includes poly 1 isolation blocks that are spaced-apart from a pair of drain lines of adjacent cells along a poly 2 word line in a manner that isolates the pair of drain lines from an adjacent pair. The poly 1 isolation blocks are separated from a silicon substrate by an insulating layer and from overlying word lines by an interpoly insulator. This insulating layer also separates floating gates from the substrate. To make the cell array, an insulating-layer/poly 1/interpoly insulator stacked structure is first produced. The stacked structure is masked and patterned to define parallel, spaced-apart poly 1 strips and first and second poly 1 lines that are located between adjacent pairs of the poly 1 strips. Source and drain lines are then formed. Silicon dioxide is grown over the source and drain lines, followed by the formation of poly 2 word lines. Finally, a stacked etch is performed using the word lines as a self-aligned mask to pattern the first and second poly 1 lines to define first and second floating gates and to pattern the poly 1 strips to define poly 1 isolation blocks.

7 Claims, 11 Drawing Sheets

CONTACTLESS FLASH EPROM USING POLY SILICON ISOLATION AND PROCESS OF MAKING THE SAME

This application is a Division of Ser. No. 08/990,476 filed Dec. 15, 1997 now U.S. Pat. No. 5,847,426.

BACKGROUND OF THE INVENTION

1. Field of the Invention

The present invention relates to electrically programmable read only memory (EPROM) devices and, in particular, to a contactless flash EPROM cell array structure that includes polysilicon isolation blocks, and a process for its fabrication.

2. Description of the Related Art

An electrically programmable read only memory (EPROM) device is a non-volatile memory integrated circuit which is used to store binary data. Power can be removed from an EPROM without loss of data. That is, upon reapplying power, the originally stored binary data are retained.

In addition to its data retention capability, an EPROM can also be programmed to store new binary data. Reprogramming is accomplished by first exposing the EPROM to an ultraviolet (UV) light source in order to erase the old binary data. A UV-transparent lid on the packaged EPROM chip allows this erasure to occur. Following erasure, the new binary data are written into the EPROM by deactivating the chip select line in order to switch the EPROM's data outputs to inputs. The EPROM address inputs are then set to a starting value, the desired data are connected to the data inputs and the data are written into the data storage register identified by the address inputs. The address inputs are then incremented and the cycle is repeated for each storage register in the EPROM array.

In an EPROM read operation, the binary data stored in the data storage register identified at the address inputs are connected to the chip's data output buffers. If the EPROM's chip select signal is activated, then the binary data from the selected storage register are provided to the databus.

An electrically erasable programmable read only memory (EEPROM) device is a variation of the EPROM design wherein binary data are read, written and erased electrically. A single operation erases a selected data storage register. In the so-called "flash" EPROM device, all data storage registers in the memory array are electrically erased in a single operation.

Figure 1:
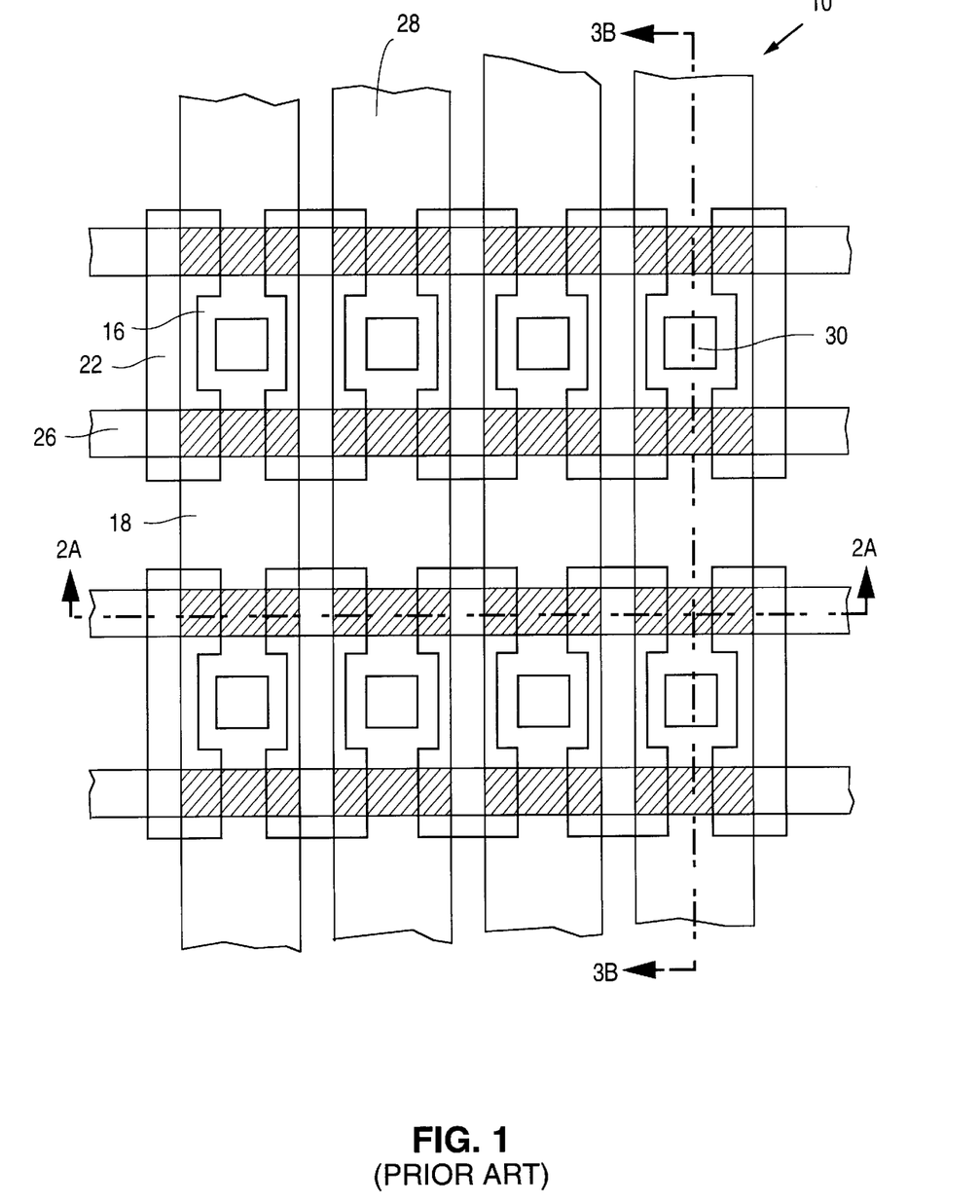
FIG. 1 is a layout of a conventional flash EPROM cell with one contact to the drain sharing two cells. The areas where poly 2 overlies poly 1 are shown in shade.
Figure 2:
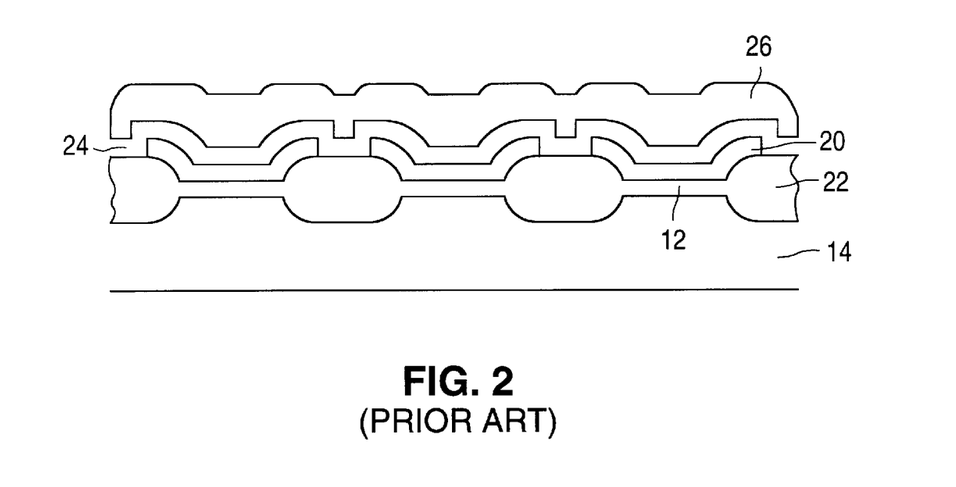
FIG. 2 is a cross-sectional view taken along line 2A—2A in FIG. 1.
Figure 3:
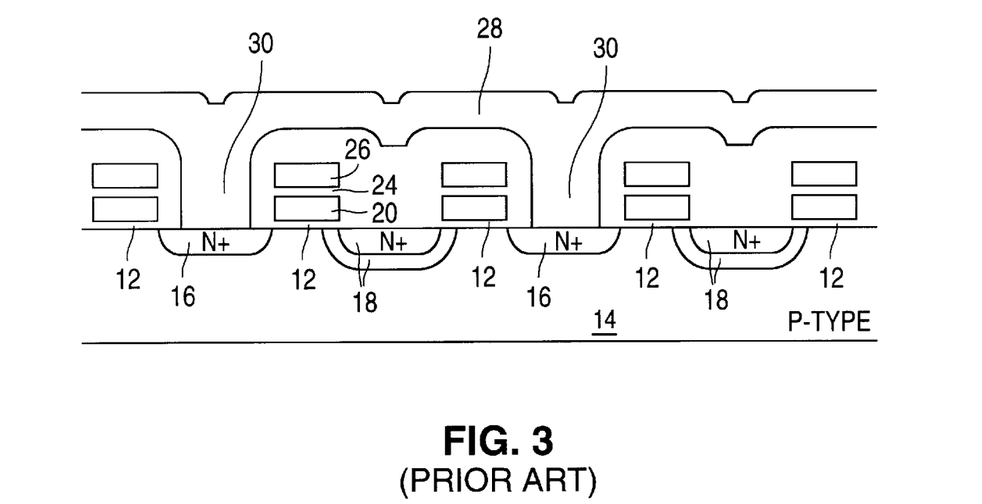
FIG. 3 is a cross-sectional view taken along line 3B—3B in FIG. 1.

A standard T-shaped flash EPROM cell array 10 is illustrated in FIGS. 1–3. The T-shaped EPROM cell array 10 includes a thin oxide 12 overlying P-type silicon substrate 14 between N+ drain regions 16 and N+ graded source regions 18, both of which are formed in P-type silicon substrate 14. A polysilicon (poly 1) floating gate 20 overlies thin oxide 12 and field oxide 22. Overlying poly 1 floating gate 20 is a layer of interpoly insulator 24, typically a composite layer of oxide-nitride-oxide (ONO). A polysilicon (poly 2) control gate 26 overlies insulating material 24. Metal bit line 28 is connected to N+ drain regions 16 by drain contacts 30. As shown in FIGS. 1 and 3, one drain contact 30 is shared by two EPROM cells of the array.

Figure 4:
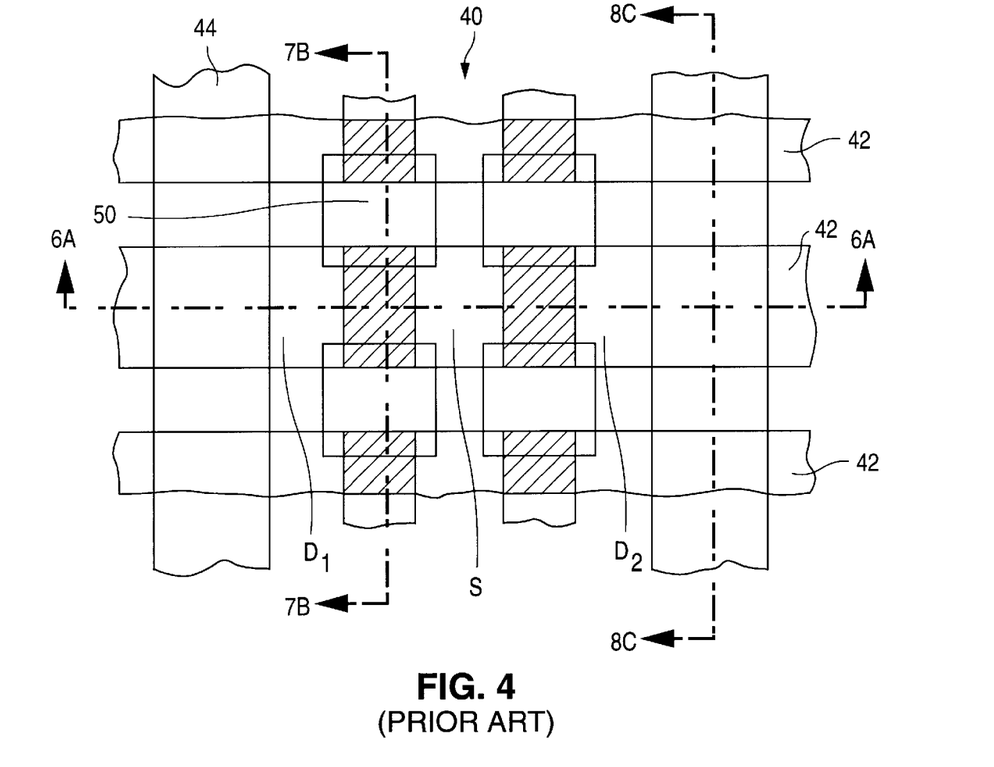
FIG. 4 is a layout of a conventional contactless EPROM cell wherein bit lines are contacted every 32 or more cells.

A conventional "contactless" flash EPROM cell is illustrated in FIGS. 4–8. As shown in FIG. 4, an EPROM cell within the array 40 does not share one contact between two cells, as is the case in the conventional flash EPROM cell. Rather, in a contactless flash EPROM, the N+ bit lines are contacted every 32, 48 or 64 cells.

Figure 5:
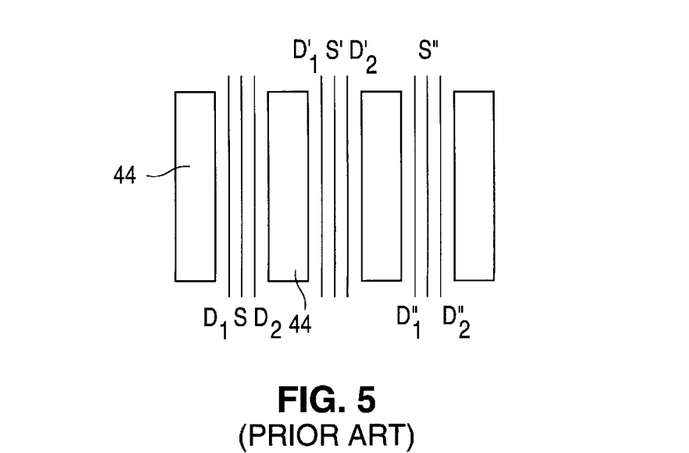
FIG. 5 is a layout of an EPROM array utilizing a conventional contactless flash EPROM cell and FOX isolation.
Figure 6:
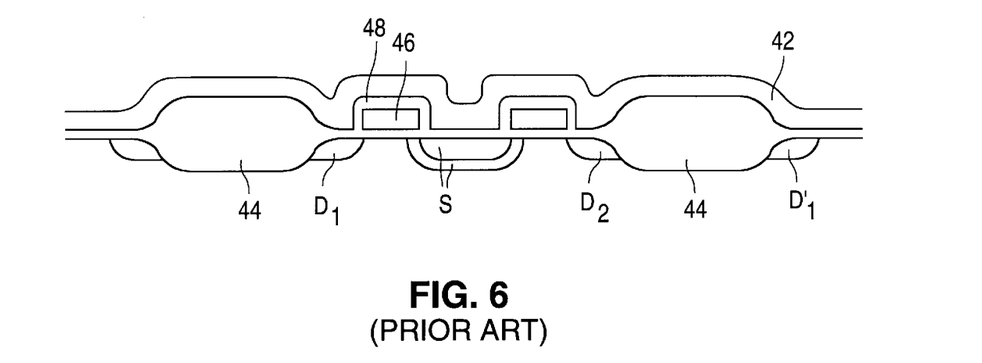
FIG. 6 is a cross-sectional view taken along line 6A—6A of FIG. 4.

As shown in FIGS. 4–6, and further described in U.S. Pat. No. 5,371,030 to Bergemont which is fully incorporated herein by reference, two adjacent cells within array 40 share the same graded source line S and are separated from other cells in the array along the same polysilicon (poly 2) word line 42 (not shown in FIG. 5) by field oxide (FOX) isolation strips 44. That is, as is best shown in FIG. 5, the separate drains $D_1$ and $D_2$ of adjacent cells share a common source S. Each column of shared-source cells is separated from adjacent shared-source cells (e.g. $D_1'/D_2'$-S' is separated from $D_1/D_2$-S and $D_1''/D_2''$-S" in FIG. 5) along the same poly 2 word line 42 by FOX isolation strips 44.

Figure 7:
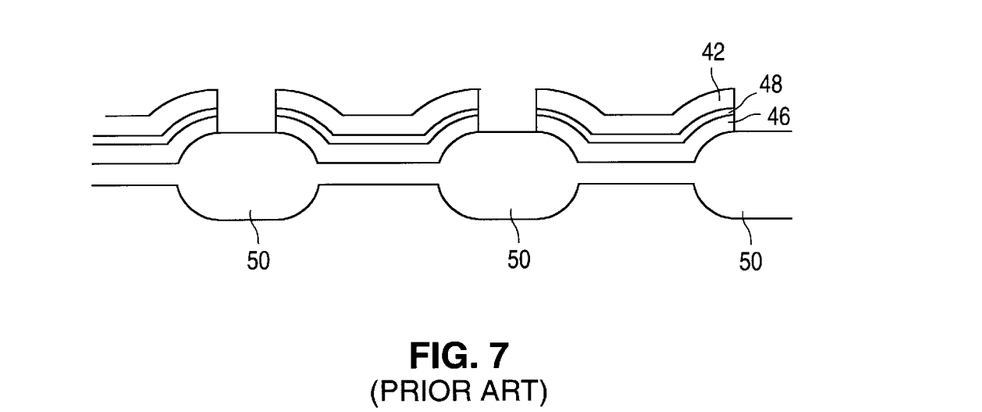
FIG. 7 is a cross-sectional view taken along line 7B—7B of FIG. 4.
Figure 8:
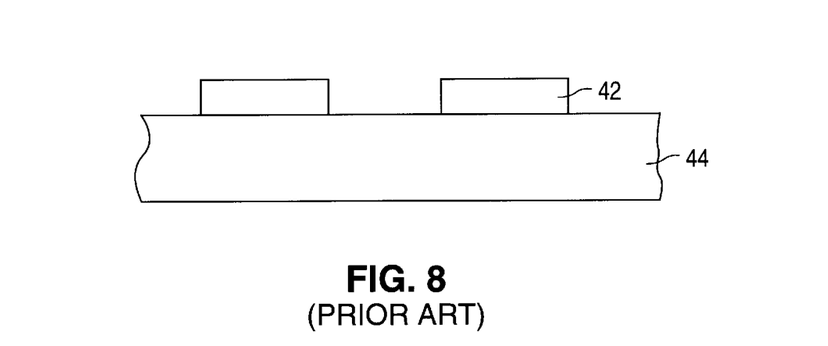
FIG. 8 is a cross-sectional view taken along line 8C—8C of FIG. 4.

As further illustrated in FIGS. 4, 6 and 7, conventional contactless flash EPROM cell array 40 includes a polysilicon (poly 1) floating gate 46, interpoly insulator 48 (typically an ONO composite layer) and array field oxide regions 50.

Traditionally, increases in EPROM, EEPROM, flash EPROM and contactless flash EPROM cell array density have been accomplished by reducing the dimensions of the cell features produced by the photolithographic and etching procedures utilized in fabricating the cells. Unfortunately, conventional FOX fabrication processes, e.g. Local Oxidation of Silicon (LOCOS), result in FOX isolation strips that are wider, due to the lateral encroachment of oxide during the thermal LOCOS growth process, than the minimum geometry that can be produced by lithographic and etching processes.

Still needed in the art is a contactless flash EPROM cell array with isolation structures of the minimum geometry and processes for their fabrication.

SUMMARY OF THE INVENTION

The present invention provides a contactless flash EPROM cell array in a silicon substrate of a certain conductivity type (typically P-type). The cell array includes a source line and a pair of drain lines, all of which are of a conductivity type (typically N-type) different from the silicon substrate conductivity type. These drain lines in the cell array run parallel with, and are disposed on opposite sides of, the source line. The source and drain lines are spaced apart from each other, defining channel regions therebetween.

The cell array further includes an insulating layer (typically silicon dioxide) overlying the silicon substrate, source line, drain lines and the channel regions. The cell array also has polysilicon (poly 1) isolation blocks. A pair of adjacent poly 1 isolation blocks sandwiches, yet is spaced-apart from, the pair of drain lines, thereby isolating these drain lines from adjacent pairs of drain lines in the cell array. The poly 1 isolation blocks are separated from the silicon substrate by the insulating layer.

The cell array also includes a pair of polysilicon (poly 1) floating gates overlying, but spaced apart from, the channel regions, by the insulating layer. A layer of interpoly insulator (typically ONO) overlies the poly 1 floating gates and the poly 1 isolation blocks. In addition, the cell array includes a polysilicon (poly 2) word line overlying, but disengaged from, the poly 1 floating gates and poly 1 isolation blocks by the layer of interpoly insulator.

In an alternative embodiment, the contactless flash EPROM cell also includes a plurality of spaced-apart array field oxide regions in the silicon substrate, located between the drain and source lines such that a poly 1 floating gate extends between pairs of the spaced-apart array field oxide regions.

Since the poly 1 isolation blocks can be sized to a minimum geometry, the cell array of the present invention has an increased density compared to conventional contactless cell arrays that utilize thermally grown field oxide isolation. The operation of the present cell is essentially identical to the operation of the cell described in U.S. Pat. No. 5,371,030, which is fully incorporated herein by reference.

The present invention also provides a process of fabricating a contactless flash EPROM cell array in a silicon substrate. The process includes a step of forming an insulating layer (typically silicon dioxide) on the silicon substrate of a certain conductivity type (typically P-type). Next, a step of forming a layer of first polysilicon (poly 1) on the insulating layer is performed and then followed by a step of forming a layer of interpoly insulator (typically ONO) to blanket the poly 1 layer. These three steps produce a insulating-layer/poly 1/interpoly insulator stacked structure.

Next, the stacked structure is masked and patterned to define a plurality of parallel, spaced-apart poly 1 strips (i.e. the precursor of poly 1 isolation blocks), and first and second poly 1 lines (i.e. the precursor of poly 1 floating gates) in between adjacent pairs of poly 1 strips. The poly 1 lines run parallel to and spaced-apart from one another, as well as the adjacent pairs of poly 1 strips. This step of masking and patterning also exposes a cell substrate region between the first poly 1 line and its adjacent poly 1 strip, between the second poly 1 line and its adjacent poly 1 strip, and between the poly 1 lines.

The masking and patterning step is followed by a step of forming, in the corresponding cell substrate region, a source line between the first and second poly 1 lines, and a drain line between the first poly 1 line and its adjacent poly 1 strip, as well as between the second poly 1 line and its adjacent poly 1 strip. The source line and drain lines are of a conductivity type (typically N-type) different from that of the silicon substrate.

Next, an oxidation step is conducted to grow silicon dioxide over the source line and the drain lines. A layer of second polysilicon (poly 2) is then deposited over the entire surface.

The poly 2 layer is masked and patterned to form a plurality of parallel, spaced-apart poly 2 word lines that overlie and run perpendicular to the first and second poly 1 lines, as well as the poly 1 strips. The poly 2 word lines are separated from the poly 1 lines and poly 1 strips by the interpoly insulator.

Finally, a stacked etch is performed where the poly 2 word lines are utilized as a self-aligned mask to pattern the first and second poly 1 lines to define first and second poly 1 floating gates, as well as to pattern the poly 1 strips to define poly 1 isolation blocks.

A better understanding of the features and advantages of the present invention will be obtained by reference to the following detailed description and accompanying drawings which set forth illustrative embodiments in which the principles of the invention are utilized.

DETAILED DESCRIPTION OF THE PREFERRED EMBODIMENT

Figure 9:
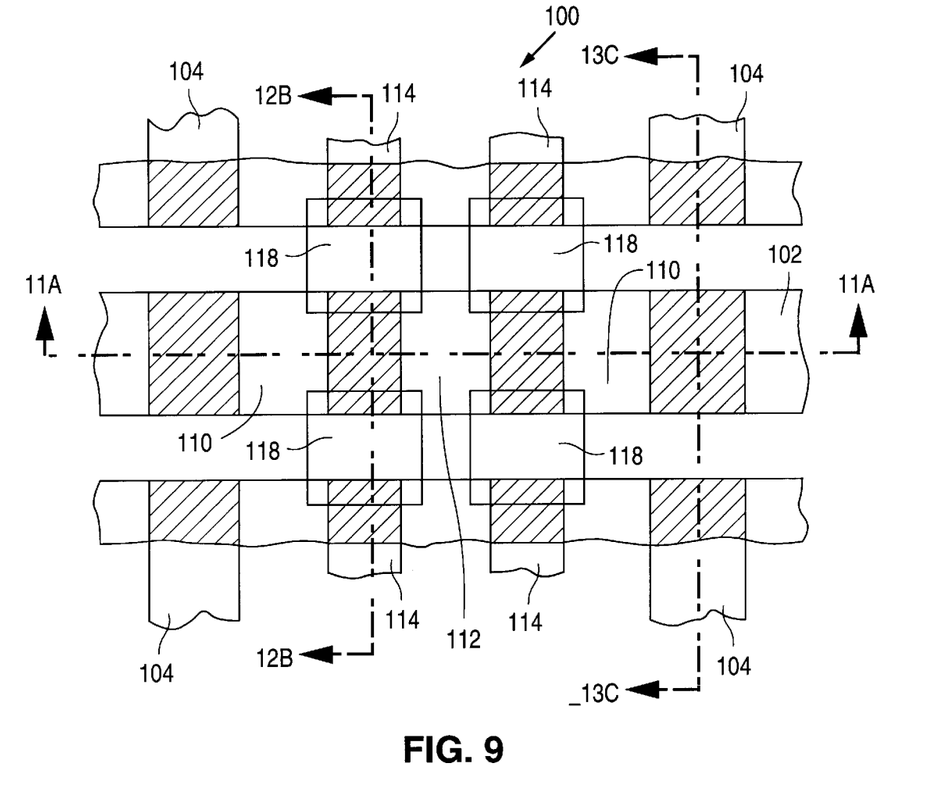
FIG. 9 is a layout of a contactless flash EPROM cell according to the present invention. The areas where the poly 2 word line 102 overlies either a poly 1 isolation block 104 or a poly 1 floating gate 114 are shaded.
Figure 10:
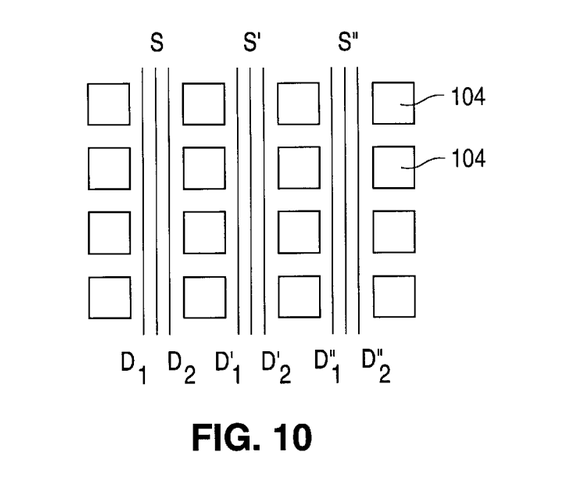
FIG. 10 is a layout of an EPROM array utilizing a contactless flash EPROM cell and poly 1 isolation block in accordance with the present invention.

FIGS. 9–10 illustrate the layout of a portion of a contactless flash EPROM cell array 100 in accordance with the present invention. Two adjacent cells within the array 100 share the same source line S and are separated from other cells in the array along the same poly 2 word line 102 (not shown in FIG. 10) by poly 1 isolation blocks 104. That is, as is best shown in FIG. 10, the separate drains $D_1$ and $D_2$ Of adjacent cells share a common source S. Each column of shared-source cells is separated from adjacent shared-source cells (e.g. $D_1'/D_2'$-S' is separated from $D_1/D_2$-S and $D_1''/D_2''$-S" in FIG. 10) along the same poly 2 word line 102 by poly 1 isolation blocks 104.

As is further shown in FIGS. 9–13, a contactless flash EPROM cell structure according to the present invention has an insulating layer 106 (typically silicon dioxide) overlying P-type silicon substrate 108 between N-type drain regions 110 and N-type source regions 112, both of which are formed in P-type silicon substrate 108. Channel regions 113 are defined between the drain regions 110 and the source regions 112. A polysilicon (poly 1) floating gate 114 overlies insulating layer 106. Overlying poly 1 floating gate 114 is a layer of interpoly insulator 116 (typically a composite layer of oxide-nitride-oxide). The portion of poly 2 word line 102 which overlies interpoly insulator 116 is known as the poly 2 control gate. Spaced-apart array field oxide (FOX) regions 118 are positioned in the silicon substrate 108 between N-type drain regions 110 and the N-type source regions 112 such that the poly 1 floating gate 114 of each cell extends between a pair of array FOX regions 118.

Figure 11:
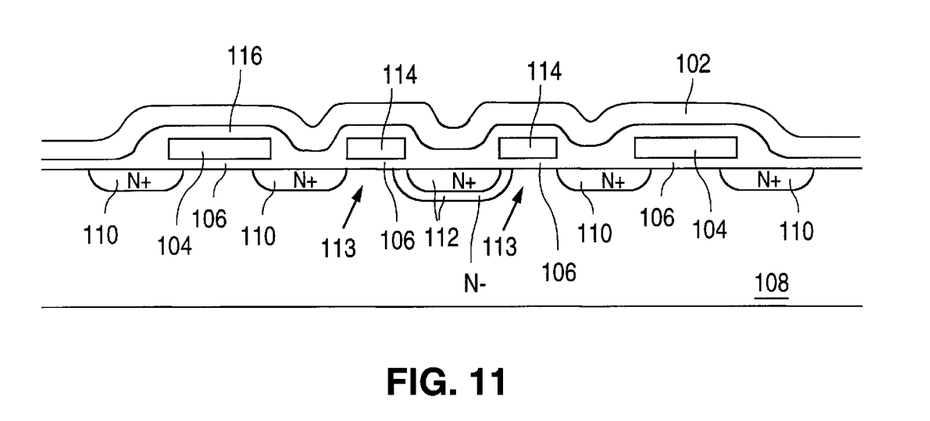
FIG. 11 is a cross-sectional view taken along line 11A—11A of FIG. 9.
Figure 12:
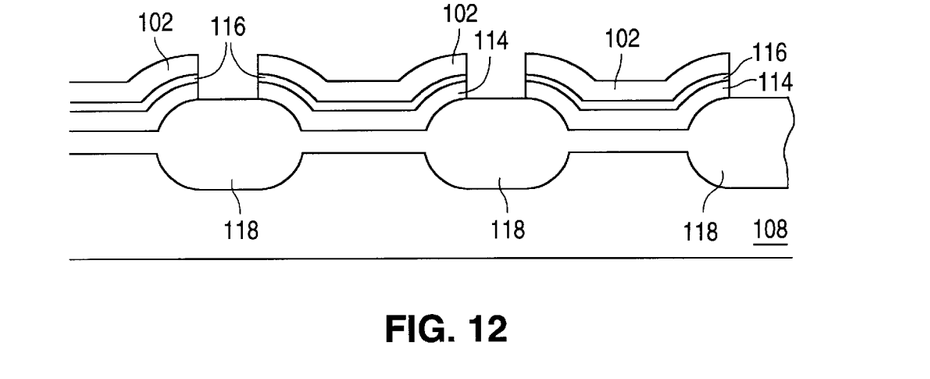
FIG. 12 is a cross-sectional view taken along line 12B—12B of FIG. 9.

N-type source region 112 may include a graded N+/N− junction, as shown in FIG. 11.

Unlike conventionally grown LOCOS FOX isolation structures, the poly 1 isolation blocks according to the present invention can be fabricated to the minimum geometry which can be produced by lithographic and etch processes. For example, utilizing a process that can produce a minimum geometry of 0.8 microns, a typical FOX isolation structure produced by LOCOS may be 1.2 microns in total width due to bird's beak encroachment beyond the minimum geometry line. On the other hand, a poly 1 isolation block in accordance with the present invention could be 0.8 microns in width. Therefore, the contactless flash EPROM cell with polysilicon isolation blocks of the present invention may be arranged in an EPROM cell array of higher packing density than a contactless flash EPROM cell utilizing FOX isolation.

The width of the poly 1 isolation blocks must be sufficient to isolate the drain regions of one pair of adjacent cells from the drain regions of other cells along the same poly 2 word line. For example, referring to the second column of poly 1 isolation blocks illustrated in FIG. 10, each of the poly 1 isolation blocks 104 is wide enough to isolate drain region $D_1'$ from drain region $D_2$.

As will be explained in more detail below, the drain regions of the cell array are formed subsequent to the formation of a plurality of poly 1 strips (that are themselves the precursors to the poly 1 isolation blocks). These poly 1 strips function as an implant mask during the implant process used to form the drain regions. The result is drain regions that are spaced-apart, i.e. isolated, by the poly 1 isolation blocks.

Figure 14A:
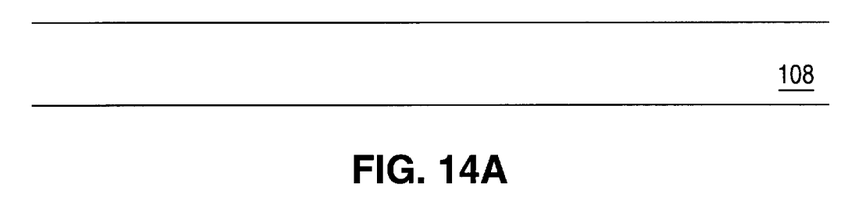
FIGS. 14A–14C illustrate cross-sections, taken respectively along lines corresponding to 11A—11A, 12B—12B and 13C—13C of FIG. 9, during the fabrication of a contactless flash EPROM cell array with polysilicon isolation blocks following the step of forming a plurality of spaced apart array FOX regions of a process of fabrication in accordance with the present invention.
Figure 14B:
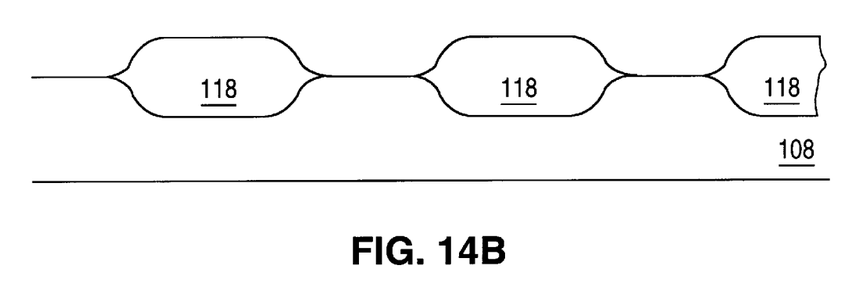
Figure 14C:
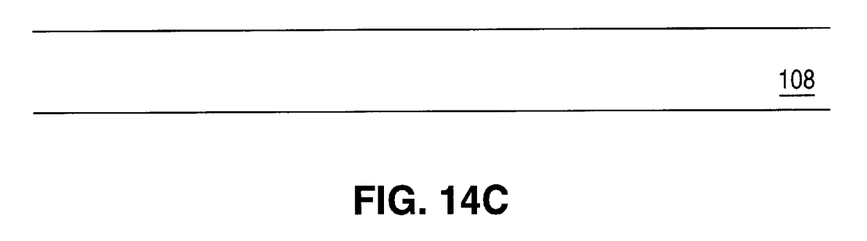

FIGS. 14A–17C illustrate a process of fabricating a contactless flash EPROM cell array according to the present invention. As illustrated in FIGS. 14A–14C, the process includes first forming a plurality of array FOX regions 118 (typically 6000 to 7000 angstroms in thickness) on a silicon substrate 108. This step is typically done by growing a pad silicon dioxide layer (pad oxide, approximately 100 angstroms in thickness) on substrate 108, depositing a silicon nitride layer (approximately 2000 angstroms in thickness) on the pad oxide, masking and etching the silicon nitride layer (using conventional techniques) to form openings in the silicon nitride through which the array FOX regions will be grown, utilizing a LOCOS process to form the array FOX regions 118 and then stripping the silicon nitride and pad oxide layers.

The next step is to grow an insulating layer (approximately 100 angstroms in thickness), such as silicon dioxide, on silicon substrate 108. A layer of first polysilicon (poly 1, approximately 2000 angstroms in thickness) is then deposited and doped in the conventional manner, such as by ion implantation or $POCl_3$ processing. Next a second layer of insulating material is formed blanketing the poly 1. This layer of second insulating material is known as the interpoly insulator, and is typically a silicon dioxide or an oxide-nitride-oxide (ONO) layered (approximately 220 angstrom oxide equivalent in thickness) composite material.

Figure 15A:
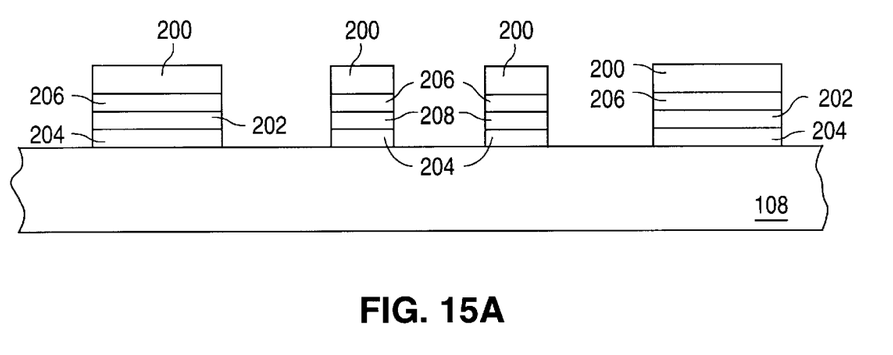
FIGS. 15A–15C illustrate cross-sections, taken respectively along lines corresponding to 11A—11A, 12B—12B and 13C—13C of FIG. 9, during the fabrication of a contactless flash EPROM cell array with poly 1 isolation blocks following the step of masking and patterning a structure to form a plurality of poly 1 strips and first and second poly 1 lines of a process of fabrication in accordance with the present invention.
Figure 15B:
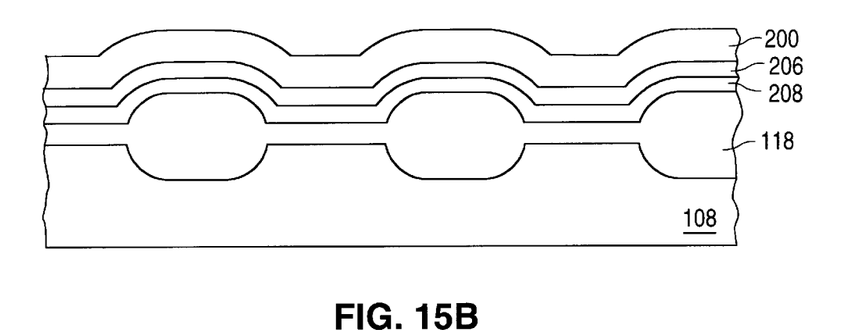
Figure 15C:
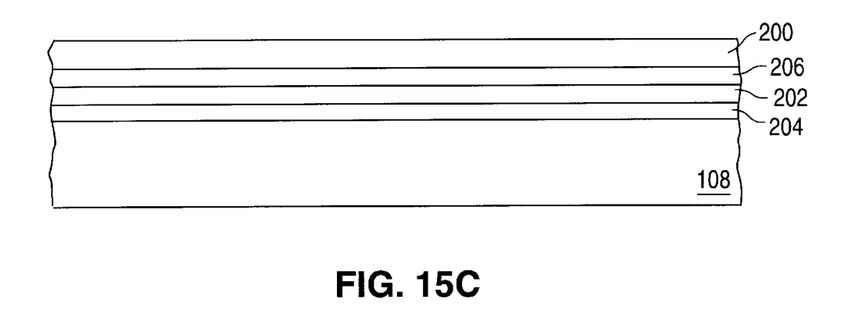

The insulating layer/poly 1/interpoly insulator stack is then masked using photoresist 200 and etched to produce, as illustrated in FIGS. 15A–15C, (i) a plurality of parallel, spaced-apart poly 1 strips 202 (i.e. the precursor of poly 1 isolation blocks) that are separated from the underlying silicon substrate 108 by the insulating layer 204 and that have interpoly insulator 206 thereon, such that a cell substrate region is defined between adjacent pairs of poly 1 strips 202 and (ii) first and second poly 1 lines 208 (i.e. the precursor of poly 1 floating gates) between adjacent pairs of poly 1 strips 202 that run parallel to and spaced-apart from one another and the adjacent pairs of poly 1 strips 202 and that are separated from the underlying silicon substrate 108 by the insulating layer 204 and that have the interpoly insulator 206 thereon.

Figure 16A:
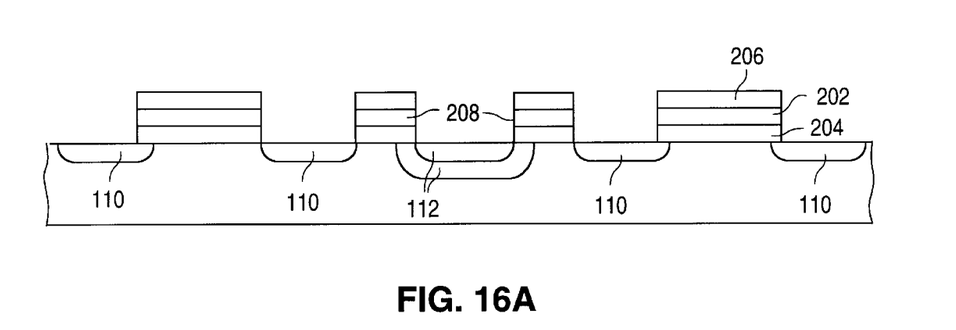
FIGS. 16A–16C illustrate cross-sections, taken respectively along lines corresponding to 11A—11A, 12B—12B and 13C—13C of FIG. 9, during the fabrication of a contactless flash EPROM cell array with poly 1 isolation blocks following the step of forming a source line and first and second drain lines of a process of fabrication in accordance with the present invention.
Figure 16B:
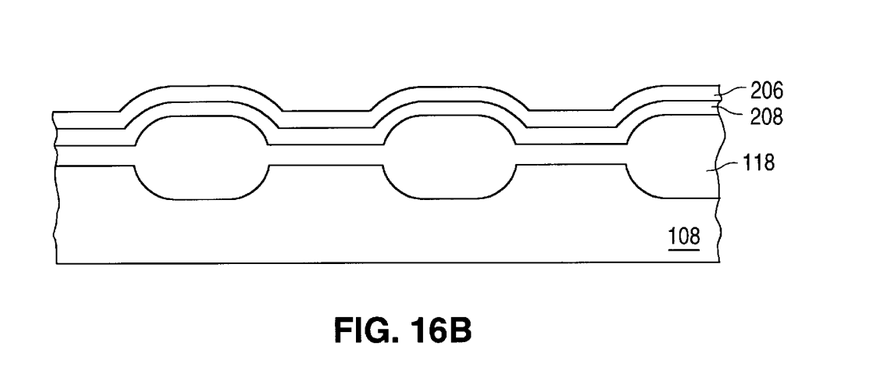
Figure 16C:
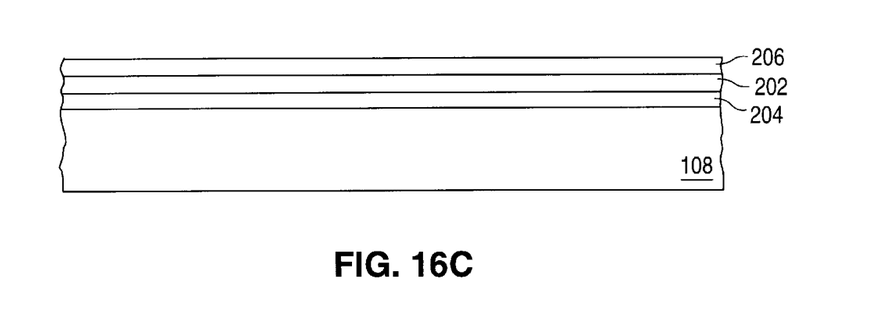

As shown in FIGS. 16A–16C, the graded source lines 112 and first and second drain lines 110 are then formed. This is typically done by performing a first N-type implant, followed by stripping the photoresist layer 200, followed by performing masking and patterning operations to expose the source region, followed by a second N-type implant.

Figure 17A:
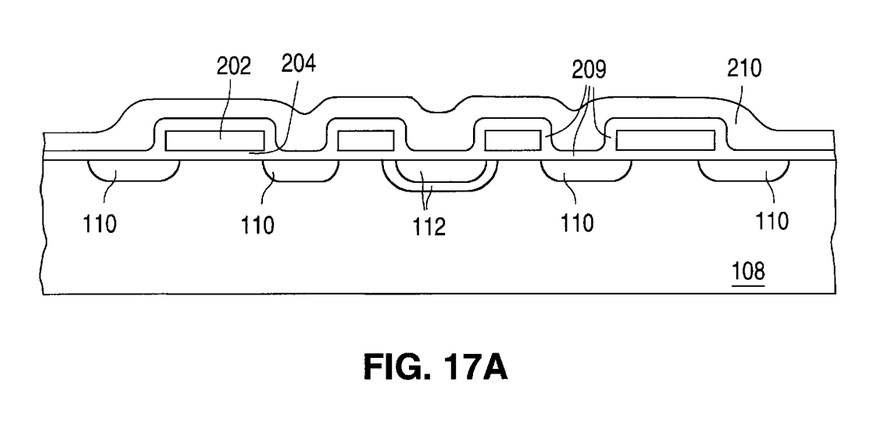
FIGS. 17A–17C illustrate cross-sections, taken respectively along lines corresponding to 11A—11A, 12B—12B and 13C—13C of FIG. 9, during the fabrication of a contactless flash EPROM cell array with poly 1 isolation blocks following the step of forming a plurality of spaced apart poly 2 word lines of a process of fabrication in accordance with the present invention.
Figure 17B:
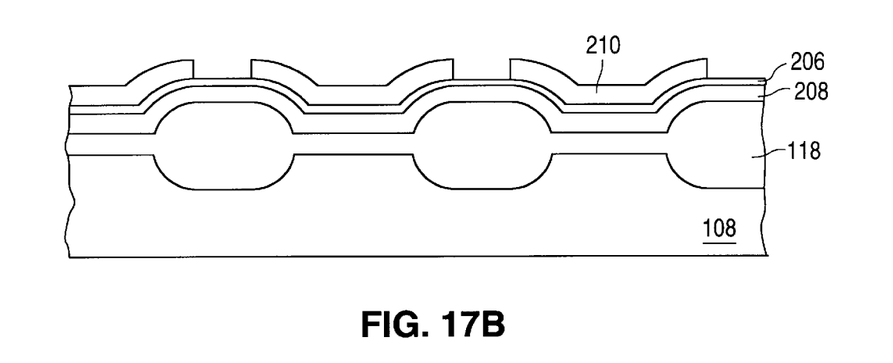
Figure 17C:
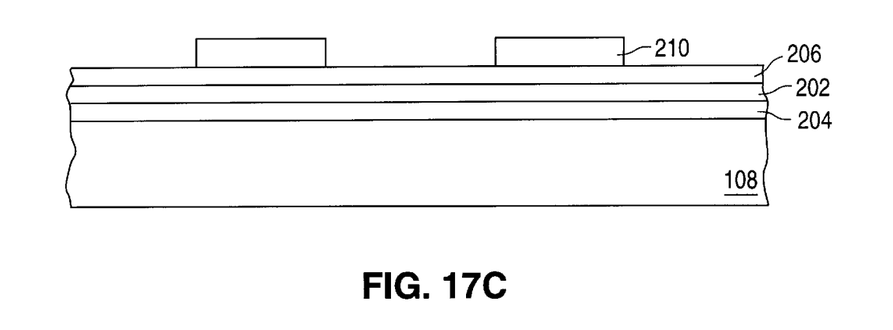

Following formation of the N-type drain lines 110 and source lines 112, an oxide layer 209 (approximately 120 angstroms in thickness) is grown on the surface of the source and drain lines (112 and 110) and edges of poly 1 strips 202 and poly 1 lines 208. Next a layer of second polysilicon (poly 2, approximately 3000 angstroms in thickness) is deposited and doped in the conventional manner. The poly 2 layer is then masked with photoresist, patterned, etched (stopping on interpoly insulator 206), and the photoresist removed to produce poly 2 word lines 210. The resultant structures, after removal of this photoresist, are illustrated in FIGS. 17A–17C.

Figure 13:
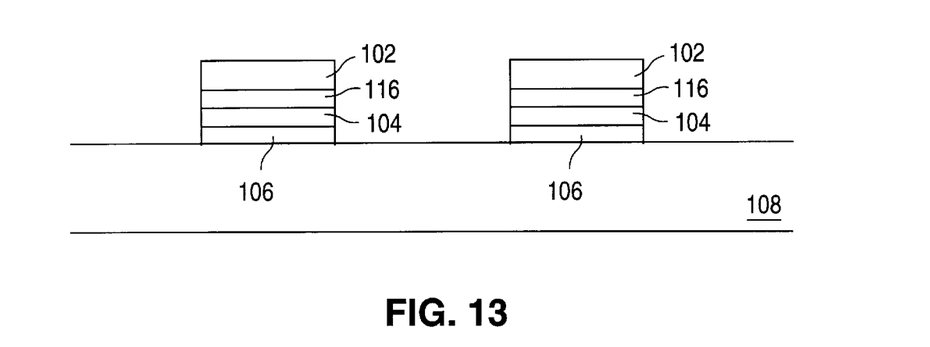
FIG. 13 is a cross-sectional view taken along line 13C—13C of FIG. 9

Following the formation of the poly 2 word lines 210, the interpoly insulator 206 and poly 1 strips 202 and poly 1 lines 208 are etched in a self-aligned stacked etch step that utilizes the poly 2 word lines 210 to give definition to the poly 1 floating gates 114 and poly 1 isolation blocks 104 of the contactless flash EPROM cell with polysilicon isolation blocks, as shown in FIGS. 9, 11 and 13. Following the stacked etch step, the contactless flash EPROM cell array with polysilicon isolation blocks has a structure equivalent to that shown in FIGS. 9–13.

Figure 18:
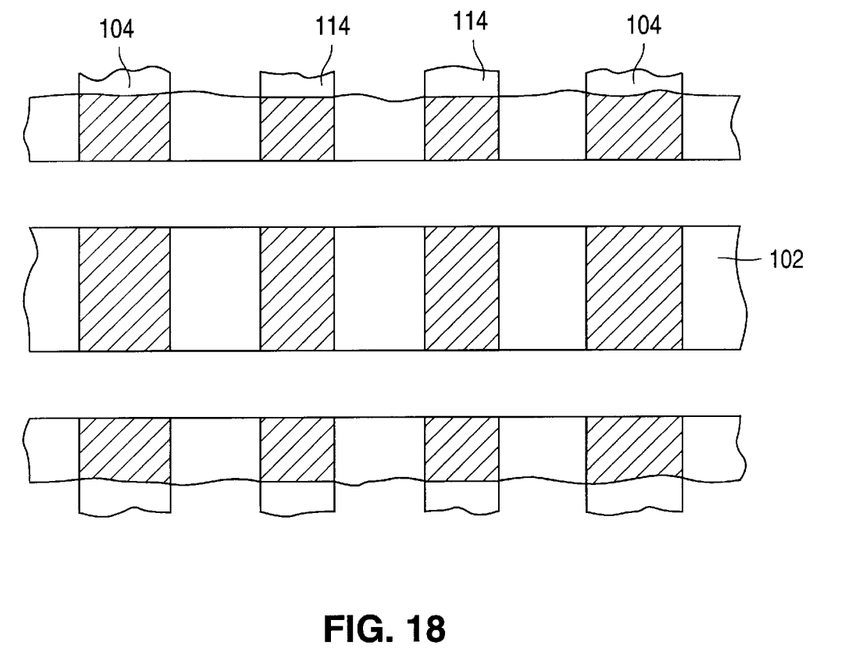
FIG. 18 is a layout illustrating a "field-less" contactless flash EPROM array in accordance with the present invention.

FIG. 18 illustrates another embodiment of a contactless flash EPROM array in accordance with the present invention. The array of FIG. 18 is a so-called "field-less" array and is identical to that of FIG. 9 with the exception that the array field oxide regions 118 of FIG. 9 are absent in the array of FIG. 18. This embodiment of the invention can be fabricated by the process described above, without the step of forming the array field oxide regions.

Figure 19:
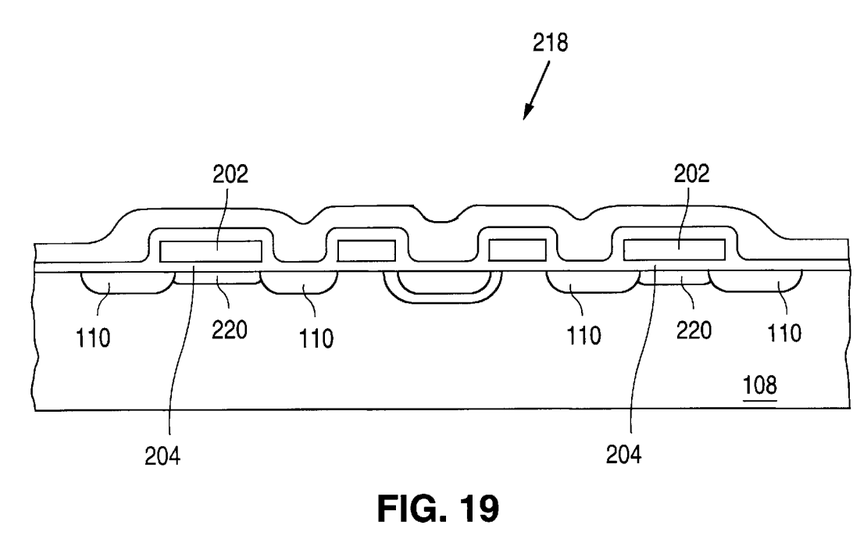
FIG. 19 is a cross-sectional view of a contactless flash EPROM cell according to the present invention that includes isolation regions in the silicon substrate below the poly 1 isolation blocks.

FIG. 19 illustrates another embodiment of a contactless flash EPROM array 218 in accordance with the present invention. In this embodiment, isolation regions 220 are located in silicon substrate 108 below poly 1' isolation blocks 202. In all other respects this embodiment is identical to the structures illustrated in FIGS. 9–13 and 17A–C.

While isolation regions 220 are of the same conductivity type as the silicon substrate 108, their conductivity is higher than that of the silicon substrate 108. This higher conductivity increases the threshold voltage of an isolation transistor, formed by a combination of a poly 1 isolation block 202, its underlying insulating layer 204, the drain lines 110 (N-type) that are on opposite sides of the poly 1 isolation block and the portion of the silicon substrate (P-type) that lies between the drain lines. The increased threshold voltage improves the electrical isolation between the drain regions of one pair of adjacent cells and the drain regions of other cells along the same poly 2 word line.

The embodiment of FIG. 19 can be fabricated by the process described above in relation to FIGS. 14A–17C with an additional step, prior to the deposition of the layer of poly 1, of forming isolation regions with the same conductivity type as the silicon substrate in the silicon substrate. The isolation regions are formed in selected locations of the silicon substrate so that they will, at the completion of the process, lie below the poly 1 isolation blocks. The isolation regions can be fabricated, for example, by ion implantation through a patterned photoresist layer. For a P-type boron doped silicon substrate, a boron implant would typically be used to form the isolation regions.

It should be understood that various alternatives to the embodiments of the invention described herein may be employed in practicing the invention. It is intended that the following claims define the scope of the invention and that processes and structures within the scope of these claims and their equivalents are covered thereby.

What is claimed is:

1. A method of fabricating a contactless flash EPROM cell array, the method comprising the steps of:

providing a silicon substrate of a first conductivity type;

forming an insulating layer on the silicon substrate;

forming a layer of first polysilicon (poly 1) overlying the insulating layer;

forming a layer of interpoly insulator overlying the layer of poly 1 to produce an insulating layer/poly 1/interpoly insulator stacked structure;

masking and patterning the stacked structure to define (i) a plurality of parallel, spaced-apart poly 1 strips that are separated from the underlying silicon substrate by the insulating layer and that have the interpoly insulator thereon such that a cell substrate region is defined between adjacent pairs of segment poly 1 strips and (ii) first and second poly 1 lines between adjacent pairs of poly 1 strips that run parallel to and spaced-apart from one another and the adjacent pairs of poly 1 strips and that are separated from the underlying substrate by the insulating layer and that have the interpoly insulator thereon;

forming, in each cell substrate region, simultaneously both (i) a source line of a second conductivity type in said cell substrate region between the first and second poly 1 lines and (ii) first and second drain lines of a second conductivity type in the cell substrate region between the first poly 1 line and its adjacent poly 1 strip and the second poly 1 line and its adjacent poly 1 strip, respectively;

performing an oxidation step to form oxide layer over the source line and the first and second drain lines;

forming a plurality of parallel, spaced-apart second polysilicon (poly 2) word lines overlying and running perpendicular to the first and second poly 1 lines and perpendicular to the first poly 1 strips and separated therefrom by the interpoly insulator; and performing a stacked etch wherein the poly 2 word lines are utilized as a self-aligned mask to pattern the first and second poly 1 lines to define first and second poly 1 floating gates and to pattern the poly 1 strips to define a plurality of poly 1 isolation blocks;

whereby EPROM cells are defined at each crossing of the poly 2 word lines and an underlying poly 1 floating gate.

2. The method of claim 1 wherein the step of providing a silicon substrate of a first conductivity type includes providing a silicon substrate of P-type conductivity.

3. The method of claim 1 wherein the step of forming an insulating layer on the silicon substrate includes forming a silicon dioxide insulating layer on the silicon substrate.

4. The method of claim 1 wherein the step of forming a layer of interpoly insulator includes forming a layer of silicon dioxide interpoly insulator.

5. The method of claim 1 wherein the step of forming a layer of interpoly insulator includes forming a layer of oxide-nitride-oxide interpoly insulator.

6. The method of claim 1 further comprising the step of:

forming, prior to the formation of the layer of first polysilicon, a plurality of spaced-apart array field oxide regions in the silicon substrate, such that when the method is complete, a poly 1 floating gate of each EPROM cell extends between pairs of the spaced-apart field oxide regions.

7. The method of claim 1 further comprising the step of:

forming, prior to the formation of the layer of poly 1, a plurality of isolation regions of the first conductivity type in the silicon substrate, the plurality of isolation regions having a conductivity greater than a conductivity of the silicon substrate, such that when the method is complete, an isolation region is below each of the plurality of poly 1 isolation blocks.

* * * * *